US008947963B2

(12) United States Patent
McCombs

(10) Patent No.: US 8,947,963 B2
(45) Date of Patent: Feb. 3, 2015

(54) VARIABLE PRE-CHARGE LEVELS FOR IMPROVED CELL STABILITY

(71) Applicant: Apple Inc., Cupertino, CA (US)

(72) Inventor: Edward M McCombs, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/739,546

(22) Filed: Jan. 11, 2013

(65) Prior Publication Data
US 2014/0198594 A1 Jul. 17, 2014

(51) Int. Cl.
G11C 7/00 (2006.01)
G11C 7/12 (2006.01)

(52) U.S. Cl.
CPC ........................................ G11C 7/12 (2013.01)
USPC ........................................................ 365/203

(58) Field of Classification Search
CPC ................................ G11C 7/12; G11C 7/1048
USPC ........................................................ 365/203
See application file for complete search history.

(56) References Cited

U.S. PATENT DOCUMENTS

| 6,275,430 | B1 | 8/2001 | Ka |
| 7,463,531 | B2 | 12/2008 | Hemink et al. |
| 7,808,852 | B2 | 10/2010 | Yang et al. |
| 8,351,274 | B2 | 1/2013 | Ha et al. |
| 2004/0081009 | A1* | 4/2004 | Mangyo et al. ............... 365/203 |
| 2007/0230262 | A1* | 10/2007 | Origasa ......................... 365/203 |
| 2008/0181038 | A1* | 7/2008 | Clinton ......................... 365/203 |
| 2012/0033489 | A1 | 2/2012 | Song et al. |

* cited by examiner

Primary Examiner — Anthan Tran
(74) Attorney, Agent, or Firm — Meyertons, Hood, Kivlin, Kowert & Goetzel, P.C.

(57) ABSTRACT

Embodiments of a memory device are disclosed that may allow for multiple pre-charge voltages. The memory device may include a plurality of data lines, and a plurality of pre-charge circuits. Each of the plurality of data lines may be coupled to a plurality of data storage cells. Each of the plurality of pre-charge circuits may be coupled to a respective data line, and be configured to charge the data line to a first voltage level responsive to a first control signal. Each of the plurality of pre-charge circuits may also be configured to charge the respective data line to a second voltage responsive to a second control signal.

19 Claims, 11 Drawing Sheets

VARIABLE PRE-CHARGE LEVELS FOR IMPROVED CELL STABILITY

BACKGROUND

1. Technical Field

This invention is related to the field of integrated circuit implementation, and more particularly to the implementation of memories.

2. Description of the Related Art

Computing systems may include one or more systems on a chip (SoC), which may integrate a number of different functions, such as, graphics processing, onto a single integrated circuit. With numerous functions included in a single integrated circuit, chip count may be kept low in mobile computing systems, such as tablets, for example, which may result in a smaller form factor for such mobile computing systems.

Memories, such as those included in SoC designs, typically include a number of data storage cells arranged in an array, and composed of transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-coupled inverters may be employed to form a static storage cell, or a floating gate metal-oxide semiconductor field-effect transistor (MOSFET) may be used to create a non-volatile memory.

As semiconductor process technology has continued to evolve, thicknesses of various insulating layers on a semiconductor have reduced. In order to accommodate such insulating layers, power supply voltages have been lowered to limit the strain resulting from electric fields applied across the insulating layers.

In some cases, power supply voltages have been reduced to the point where some circuits do not perform as intended, or margin previously present in a circuit design may no longer be available. Memories, such as those described above, may be sensitive to these lower power supply voltages. Lower power supply voltages in conjunction with manufacturing variation in MOSFETs within a memory, may result in memory sub-circuits, such as, e.g., sense amplifiers or data storage cells, not operating as intended.

SUMMARY OF THE EMBODIMENTS

Various embodiments of a memory circuit are disclosed. Broadly speaking, a circuit and a method are contemplated in which a memory circuit includes a plurality of data lines and a plurality of pre-charge circuits. Each of the plurality of data lines may be coupled to a plurality of data storage cells. Each of the plurality of pre-charge circuits may be coupled to a respective one of the plurality of data lines, and may be configured to charge the respective data line to a first voltage or a second voltage, responsive to a first control signal or a second control signal, respectively.

In another embodiment, the first voltage may be lower than the second voltage. The first control signal may, in a further embodiment, be dependent upon the start of a memory access.

A control circuit configured to decode a received address may be included in another embodiment. In a further embodiment, the second control signal may be dependent upon the decoded received address.

BRIEF DESCRIPTION OF THE DRAWINGS

The following detailed description makes reference to the accompanying drawings, which are now briefly described.

Figure 1:
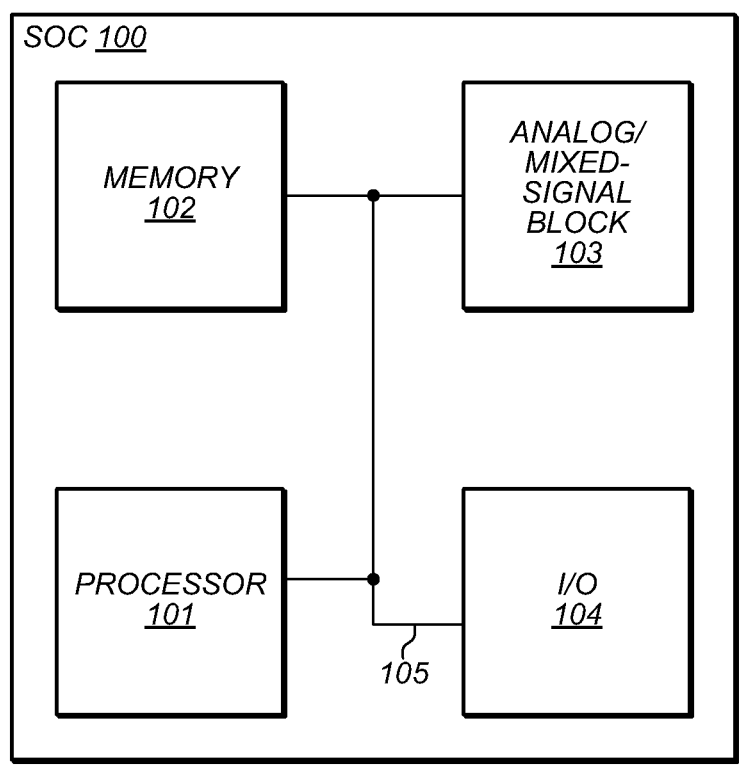
FIG. 1 illustrates an embodiment of a system-on-a-chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

Memories, along with microcontrollers and other functional blocks, may be included in a system on a chip (SoC) to integrate the function of a computing system onto a single integrated circuit. When included in an SoC, memories may be used to store program instructions to be executed by a microcontroller or processor, or data to be operated on. In some cases, memories may be included in SoCs as separate functional blocks, in addition to being included as sub-blocks within other functional blocks such as, cache memories within a processor, for example.

In some memory architectures, multiple data storage cells are connected to a common data or bit line in a wired-OR fashion. Dependent upon the type of data storage cell employed in a memory design, the bit line may need to be initialized before a data storage cell may be accessed. In some memory designs, the bit line may be initialized to the voltage level of the power supply. This type of bit line initialization (commonly referred to as "pre-charging") may contribute to leakage through from the bit line into the data storage cell consuming extra power. In some cases, the pre-charge voltage on the bit line may cause a data storage cell to unintentionally change data state, corrupting data stored in the cell. The characteristic of whether or not a data storage cell will unintentionally change state is often referred to as the data storage cell's "stability."

A data storage cell's stability may be improved by modifying the characteristics of devices included in the cell. When modification of the data storage cell is not possible, other techniques, such as, e.g., multiple pre-charge voltages may be employed to improve cell stability. The embodiments illustrated in the drawings and described below may provide techniques for the providing multiple pre-charge voltages to data storage cells within a memory array.

System-on-a-Chip Overview

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more register files and memories.

In some embodiments, processor 101 may implement any suitable instruction set architecture (ISA), such as, e.g., the ARM™, PowerPC™, or x86 ISAs, or combination thereof. Processor 101 may include one or more bus transceiver units that allow processor 101 to communication to other functional blocks within SoC 100 such as, memory block 102, for example.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferroelectric Random Access Memory (FeRAM), for example. In some embodiments, memory block 102 may be configured to store program code or program instructions that may be executed by processor 101. Memory block 102 may, in other embodiments, be configured to store data to be processed, such as graphics data, for example.

It is noted that in the embodiment of an SoC illustrated in FIG. 1, a single memory block is depicted. In other embodiments, any suitable number of memory blocks and memory types may be employed.

Analog/mixed-signal block 103 may include a variety of circuits including, for example, a crystal oscillator, a voltage reference, a current reference, a phase-locked loop (PLL) or delay-locked loop (DLL), an analog-to-digital converter (ADC), and a digital-to-analog converter (DAC) (all not shown). In other embodiments, analog/mixed-signal block 103 may be configured to perform power management tasks with the inclusion of on-chip power supplies, voltage regulators, and clock frequency scaling circuitry. Analog/mixed-signal block 103 may also include, in some embodiments, radio frequency (RF) circuits that may be configured for operation with cellular telephone networks.

I/O block 104 may be configured to coordinate data transfer between SoC 101 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol or IEEE 1394 (Firewire®) protocol, and may allow for program code and/or program instructions to be transferred from a peripheral storage device for execution by processor 101.

I/O block 104 may also be configured to coordinate data transfer between SoC 301 and one or more devices (e.g., other computer systems or SoCs) coupled to SoC 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

It is noted that the SoC illustrated in FIG. 1 is merely an example. In other embodiments, different functional blocks and different configurations of functions blocks may be possible dependent upon the specific application for which the SoC is intended.

Memory Architecture and Operation

Figure 2:
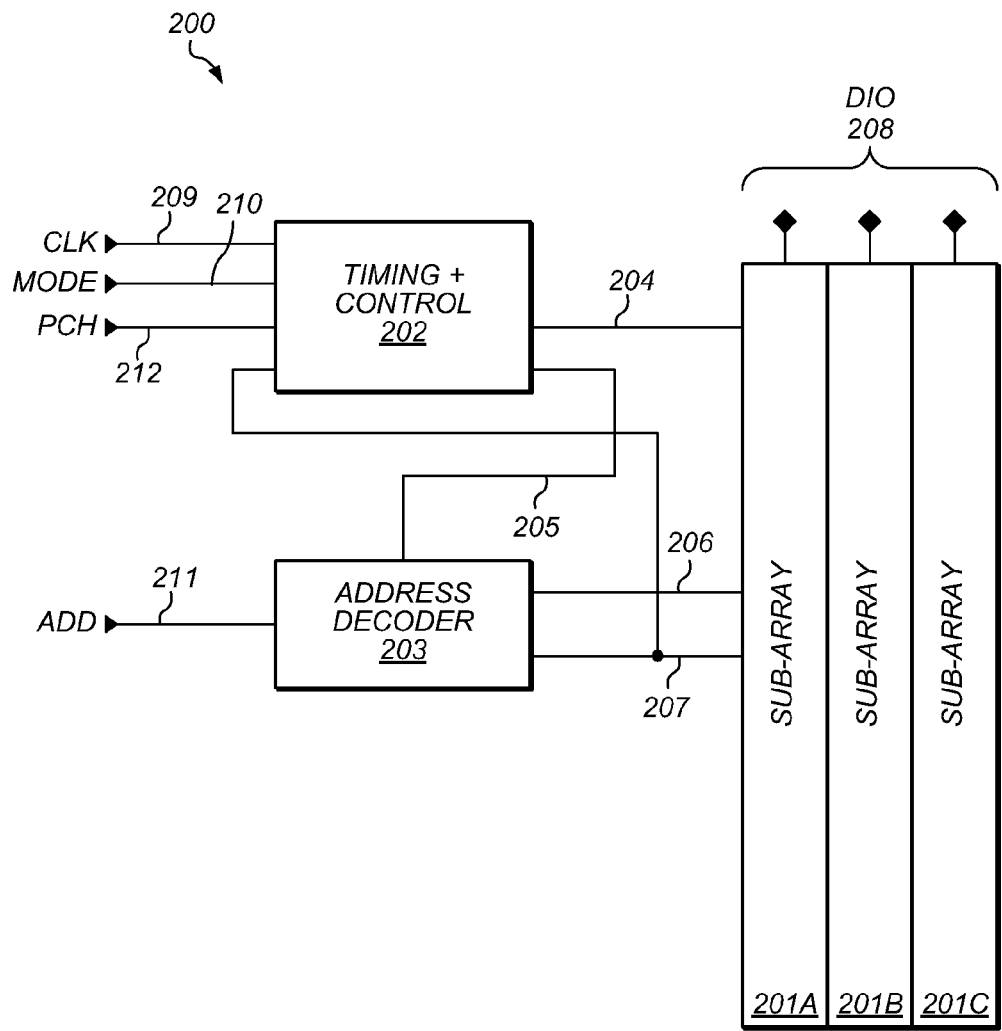
FIG. 2 illustrates an embodiment of a memory device.

Turning to FIG. 2, a memory is illustrated according to one of several possible embodiments. In some embodiments, memory 200 may correspond to memory block 102 as depicted in FIG. 1. The illustrated embodiment includes data I/O ports 208 denoted as "dio," an address bus input 211 denoted "add," mode selection input 210 denoted as "mode," pre-charge control input 212 denoted as "pch," and clock input 209 denoted as "clk."

In the illustrated embodiment, memory 200 includes sub-arrays 201a, 201b, and 201c, timing and control unit 202, address decoder 203, and address comparator 213. Timing and control unit 202 is coupled to provide a decoder enable signal 205 to address decoder 203, and control signals 204 to sub-arrays 201a-201c. In some embodiments, control signals 204 may include a sense amplifier enable signal, an output enable signal, and data input latch signal, and a pre-charge signal. The pre-charge signal may, in other embodiments, included multiple signals that may be dependent on the column selection signals 207.

Timing and control block 202 may include a state machine or state logic, and may be configured to provide control signals 204 dependent upon the status of the state machine or state logic as well as clock input 209, mode selection input 210, and pre-charge control input 212. In some embodiments, timing and control block 202 may include a decode circuit to determine the operating mode of memory 200, such as, e.g., a data storage or "write" operation, dependent upon the state of mode selection input 210. In other embodiments, timing and control block 202 may include registers configured to store previous states of mode selection input 210. A comparator configured to compare the state of mode selection input 210 to a previously stored state of mode selection input 210 may be included in timing and control block 202.

In other embodiments, the function performed by timing and control block 202 may be performed external to memory 200 by a processor, such as, e.g., processor 101 of SoC 100 as illustrated in FIG. 1. In such cases, control signals 204 may be directly supplied to memory 200 by processor 101.

Address decoder 203 is coupled to provide row selection signals 206 and column selection signals 207, in response to the assertion of decoder enable signal 205 and dependent upon the address value encoded on address bus input 211. In some embodiments, row decoder 203 may employ a n-to-$2^n$ decoding scheme, where n is the number of bits in the address value encoded on address bus input 211, or any suitable decoding scheme, to generate row selection signals 206 and column selection signals 207. The decoding scheme may be employed on a portion of the data bits included in address bus input 211 to generate row selection signals 206. The remaining data bits included in address bus input 211 may be decoded to generated column selection signals 207. Column selection signals 207 may, in various embodiments, be differentially encoded. In other embodiments, different address values may be encoded on address bus input 211 in a time-domain multiplex fashion, and address decoder 203 may be operated at different times to generate row selection signals 206 and column selection signals 207 in accordance with the time-domain multiplexing.

The decoding scheme of row decoder 203 may be implemented in accordance with one of various design styles. In some embodiments, row decoder 203 may employ a dynamic decoder in which a series of circuit nodes are pre-charged to a pre-determined voltage and one of the circuit nodes is selectively discharged dependent on the value encoded on address bus input 211. Address decoder 203 may, in various embodiments, include latches or flip-flops configured to store the values on address bus input 211 prior to the generation of row selection signals 206 and column selection signals 207.

It is noted that the memory illustrated in FIG. 2 is merely an example. In other embodiments, different numbers of memory sub-arrays, and different number of functional blocks are possible and contemplated.

Figure 3:
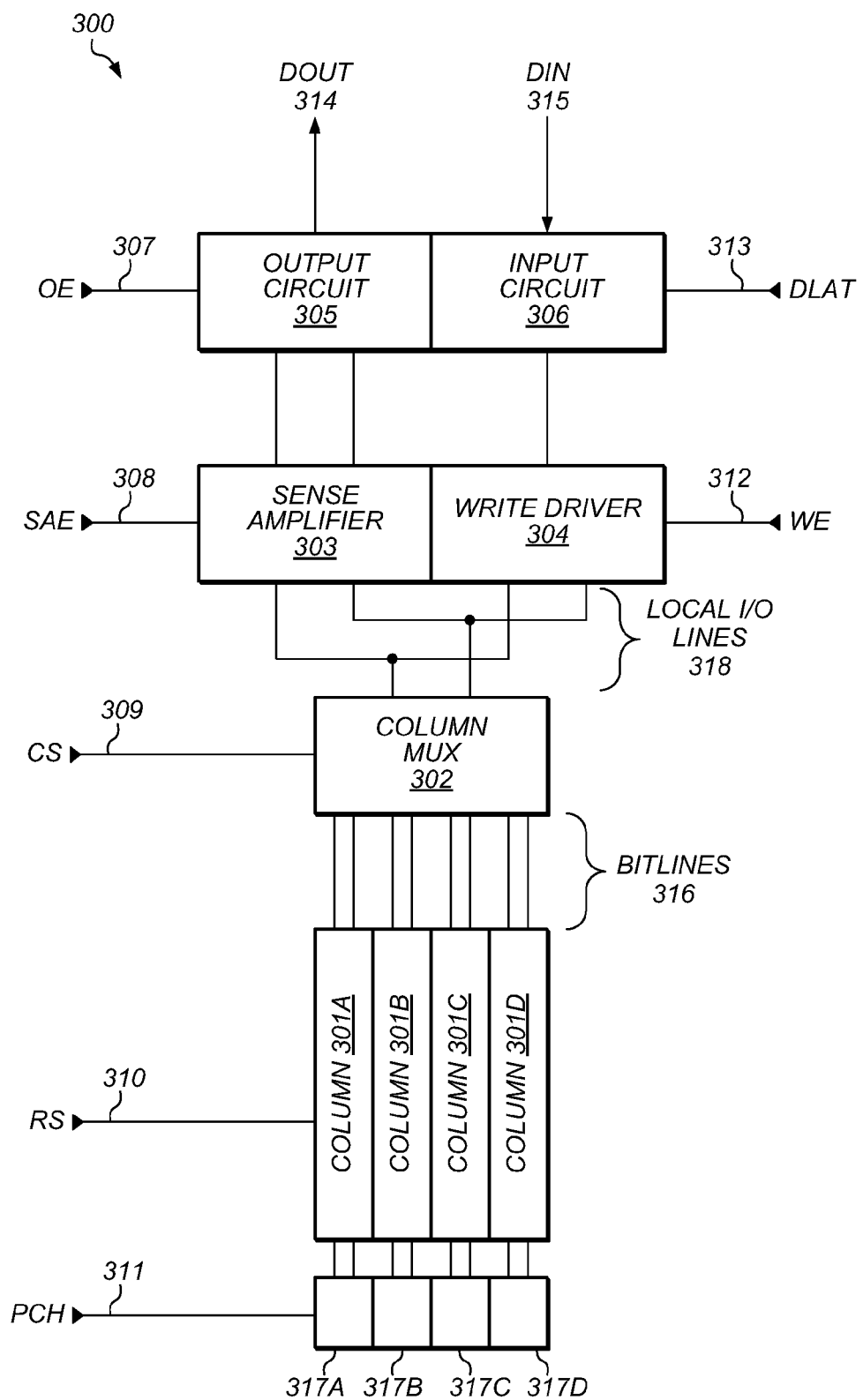
FIG. 3 illustrates an embodiment of a memory sub-array.

FIG. 3 illustrates an embodiment of a memory sub-array, which may, in some embodiments, correspond to sub-arrays 201a-201c as depicted in FIG. 2. In the illustrated embodiment, sub-array 300 includes a data output 314 denoted as "dout," a data input 315 denote as "din," an output enable input 307 denote as "oe," a sense amplifier enable input 308 denoted as "sae," a data latch control input 313 denoted as "dlat," and a write enable input 312 denoted as "we." The illustrated embodiment also includes one or more column selection input 308 denoted as "cs" one or more row selection inputs 310 denoted as "rs," and a pre-charge enable input 311 denoted as "pch."

In the illustrated embodiment, columns 301a, 301b, 301c, and 301d are coupled to the inputs of column multiplexer 302 through bit lines 316. Columns 301a, 301b, 301c, and 301d are also coupled to pre-charge circuits 317a, 317b, 317c, and 317d, respectively. The differentially encoded output of column multiplexer 302 is coupled to the differential inputs of sense amplifier 303, and the differential output of write driver 304 through local I/O lines 318. The output of sense amplifier 303 is coupled to the input of output circuit 305, and the input of write driver 304 is coupled to the output of input circuit 306.

Each column 301 may include one or more data storage cells, whose outputs are coupled to a common pair (a true bit line and a complement bit line) of bit lines 316 (also referred to as data lines). The data storage cells may be configured such that in response to the assertion of one of row selection inputs 310, a respective one of the data storage cells may output its stored data onto the pair of bit lines. In some embodiments, the data storage cells may be static storage cells, while in other embodiments, the data storage cells may be dynamic storage cells, single-bit or multi-bit non-volatile storage cells, or mask programmable read-only storage cells. It is noted that in some embodiments, the data storage cells may transmit data in a single-ended fashion. In such cases, only a single bit line per column may be required.

As will be described below in reference to FIG. 4, each of pre-charge circuits 317a, 317b, 317c, and 317d may be configured to charge bit lines 316 to an initialization voltage in response to the assertion of pre-charge enable input 311. In some embodiments, the initialization voltage may be equivalent to the power supply voltage, while, in other embodiments, the initialization voltage may be an analog voltage level such as, half of the power supply voltage, for example.

In the illustrate embodiment, pre-charge circuit 317a, 317b, 317c, and 317d may be operated simultaneously. In other embodiments, each of the aforementioned pre-charge circuits may be operated independently, allowing for a subset of the bit lines 316 to be charged to the initialization voltage.

In some embodiments, column multiplexer 302 may contain one or more pass gates controllable by column selection inputs 308. The input of each pass gate may be coupled to either the true or complement bit line output from one of columns 301a, 301b, 301c, or 301d. The output of each pass gate coupled to a true bit line may be coupled to the true output of column multiplexer 302 in a wired-OR fashion, and the output of each pass gate coupled to a complement bit line may be coupled to the complement output of column multiplexer 302 in a wired-OR fashion. In other embodiments, column multiplexer 302 may contain one or more logic gates configured to perform the multiplexer selection function.

It is noted that a pass gate (also referred to as a "transmission gate") may include an n-channel metal-oxide-semiconductor field-effect transistor (MOSFET) and a p-channel MOSFET connected in parallel. In other embodiments, a single n-channel MOSFET or a single p-channel MOSFET may be used as a pass gate. It is further noted that, in various embodiments, a "transistor" may correspond to one or more transconductance elements such as a junction field-effect transistor (JFET), for example.

Sense amplifier 303 may be configured to amplify the output of column multiplexer 302 according to one of a number of amplification techniques, such as a latched-based technique, for example. The output of sense amplifier 303 may be a digital signal, a single-ended analog signal, or any other suitable signal encoding the data selected by column multiplexer 302. In cases where the data storage cells of column 301a-301d transmit data in a single-ended fashion, sense amplifier 303 may be configured to amplify the single-ended data.

Write driver 304 may be configured to receive data from input circuit 306 and convert the receive data to a differentially encoded format for driving onto one of bit lines 316 selected by column multiplexer 302. In cases where the data storage cells of column 301a-301d receive data in a single-ended fashion, write driver 304 may be configured to drive single-ended data onto the selected bit line. In some embodiments, write driver 304 may include pre-charge circuits configured to initialize local I/O lines 318 to a pre-determined voltage. In some embodiments, the pre-determined voltage may be equivalent to the power supply voltage, while, in other embodiments, the pre-determined voltage may be an analog voltage level such as, half of the power supply voltage, for example.

Input circuit 306 may be configured to store data from data input 315 in response to the assertion of data latch control input 313. In some embodiments, data input 315 may be transmitted from a source in accordance with an interface standard such as low voltage transistor transistor logic (LVTTL) and the like. In such cases, input circuit 306 may include a level translation circuit configured to convert the data received on data input 315 to logic levels and encoding style suitable for use with write driver 304.

Output circuit 305 may be configured to convert the differentially encoded output of sense amplifier 303 into single-ended data prior to output on data output 314 in accordance with any number of interface standards such as, LVTTL, low voltage complementary metal-oxide semiconductor (LVCMOS), low voltage differential signaling (LVDS), and the like. In some embodiments, output enable input 307 may control the impedance of output circuit 305, allowing for a high impedance state such that multiple circuits may be coupled to data output 314 in a wired-OR fashion.

It is noted that the sub-array illustrated in FIG. 3 is merely an example. In other embodiments, different circuit blocks and different arrangement of circuit blocks may be employed.

Pre-charge Circuits and Pre-Charge Operation

Figure 4:
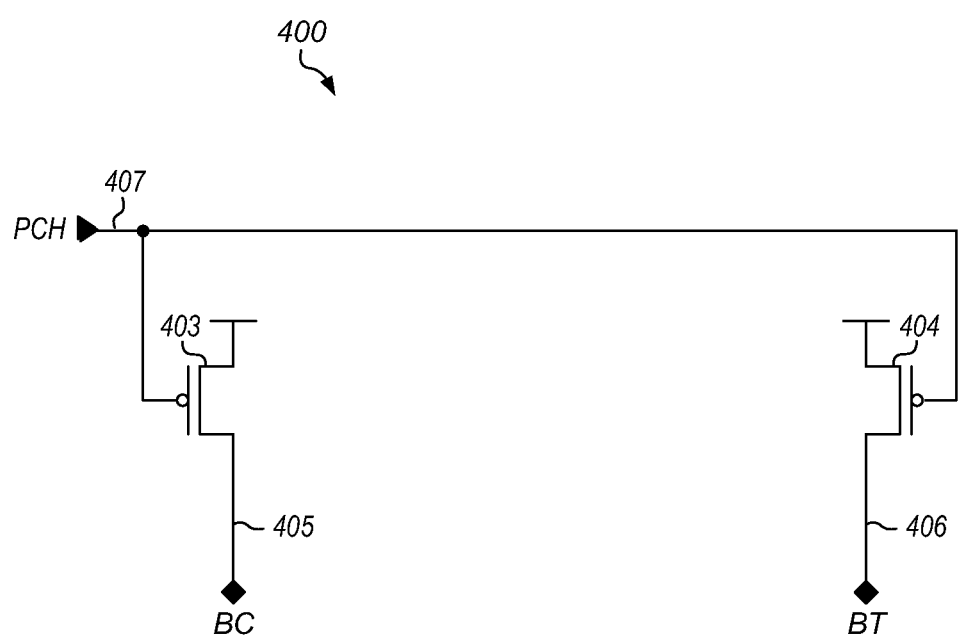
FIG. 4 illustrates an embodiment of a pre-charge circuit.

An embodiment of a pre-charge circuit that may be employed as one of pre-charge circuits 317a-317d of sub-array 300 is illustrated in FIG. 4. In the illustrated embodiment, pre-charge circuit 400 includes a pre-charge control input 407 denoted as "pch," a complement bit line port 405 denoted as "bc," and a true bit line port 406 denoted as "bt."

In pre-charge circuit 400, pre-charge control input controls pull-up devices 403 and 404. Pull-up device 403 is coupled to complement bit line port 405, and pull-up device 404 is coupled to true bit line port 406.

It is noted that a pull-up device may include one or more devices connected between a circuit node and a power supply node. The devices may be controlled by a single control signal, or each device may be individually controlled. In some embodiments, the devices may be p-channel MOSFETs, or any other suitable transistor.

Prior to a read or write operation to a memory, such as memory 200 as illustrated in FIG. 2, pre-charge circuit 400 may be activated to initialize bit lines to a pre-determined value. Pre-charge control input 407 may be set to a logic low level, thereby activating pull-up devices 403 and 404. Once activated, pull-up devices 403 and 404 supply current to complement bit line port 405 and true bit line port 406, respectively, charging the bit line ports to the supply voltage.

When a read or write operation begins, pre-charge control input 407 may be set to a logic high level, thereby deactivating pull-up devices 403 and 404. During a read operation, a selected data storage cell may discharge either the true or complement bit line dependent upon the data stored in the cell. For example, if the data storage cell contains a logical-1, then the complement bit line may discharge. Pre-charge circuit 400 may sense the accompanying decrease in voltage on complement bit line port 405.

During a write operation, a write driver circuit, such as write driver circuit 304 as illustrated in FIG. 3, may drive a selected true or complement bit line (selected by column multiplexer 302, for example), to a low logic level dependent upon the data to be written. For example, if the data to be written is a logical-0, then the write driver circuit may discharge the selected true bit line.

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

The pre-charge circuit depicted in FIG. 4 is merely an example. In other embodiments, different types and arrangements of transistors are possible.

Figure 5:
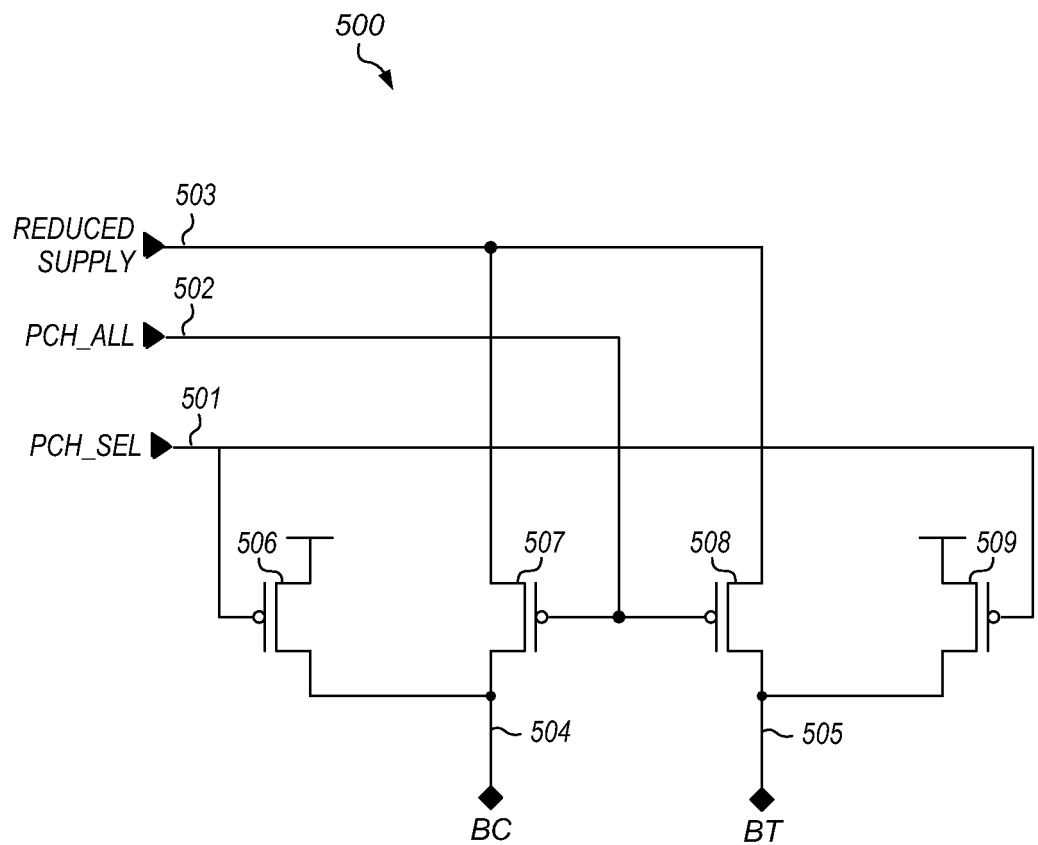
FIG. 5 illustrates another embodiment of a pre-charge circuit.

A particular embodiment of a pre-charge circuit that may correspond to pre-charge circuits 317a-317d of sub-array 300 is illustrated in FIG. 5. In the illustrated embodiments, pre-charge circuit 500 includes a reduced power supply 503 denoted as "reduced supply," a pre-charge all signal 502 denoted as "pch_all," a pre-charge selected signal 501 denoted as "pch_sel," a complement bit line port 504 denoted as "bc," and a true bit line port 505 denoted as "bt." In various embodiments, complement bit line port 504 and true bit line port 505 may be coupled to a pair of bit lines 316 as depicted in sub-array 300 as illustrated in FIG. 3.

In pre-charge circuit 500, pre-charge selected signal 501 controls pull-up devices 507 and 508, which are coupled to complement bit line port 504 and true bit line port 505, respectively. Pre-charge all signal 502 controls devices 506 and 509, which are both coupled to reduced power supply 503. Devices 506 and 509 are further coupled to complement bit line port 504 and true bit line port 505, respectively. In various embodiments, pull-up devices 507 and 508, and devices 506 and 509 may be p-channel MOSFETs.

During operation, reduced power supply 503 may be set to an analog voltage level by a local power supply generator that may include a voltage regulator, a charge pump, and other suitable circuits for generating an maintaining an analog voltage level. In some embodiments, the analog voltage level may be determined dependent power requirements of a memory device, or on characteristic of data storage cells, such as, e.g., cell stability, or any other suitable characteristic, or performance metric. Pre-charge all signal 502 and pre-charge selected signals maybe set to high, thereby turning off pull-up devices 507 and 508, and devices 506 and 509.

Prior to the beginning of an access to a memory, such as, e.g., memory 200 as illustrated in FIG. 2, pre-charge all signal 502 may be set low, thereby activating devices 506 and 508. Once activated, devices 506 and 509 source current from reduced power supply 503 to complement bit line port 504 and true bit line port 505, respectively. Bit lines coupled to complement bit line port 504 and true bit line port 505 may then be charge to the voltage level of reduced power supply 503.

In some embodiments, pre-charge all signal may then be set to a high level to turn off devices 506 and 509. When the column (or pair of data lines) coupled to complement bit line port 504 and true bit line port 505 are selected as part of a read operation, pre-charge selected signal 501 may be set low, activating pull-up devices 507 and 508. Once activated, pull-up devices 507 and 508 source additional change until the bit lines coupled to complement bit line port 504 and true bit line port 505 are charged to the power supply voltage level. In some embodiments, a control circuit such as timing and control circuit 202 of memory 200 as illustrated in FIG. 2 may generate pre-charge selected signal 501.

It is noted that the embodiment illustrated in FIG. 5 is merely an example. In other embodiments, different numbers of devices and different configurations of devices are possible and contemplated.

Figure 6:
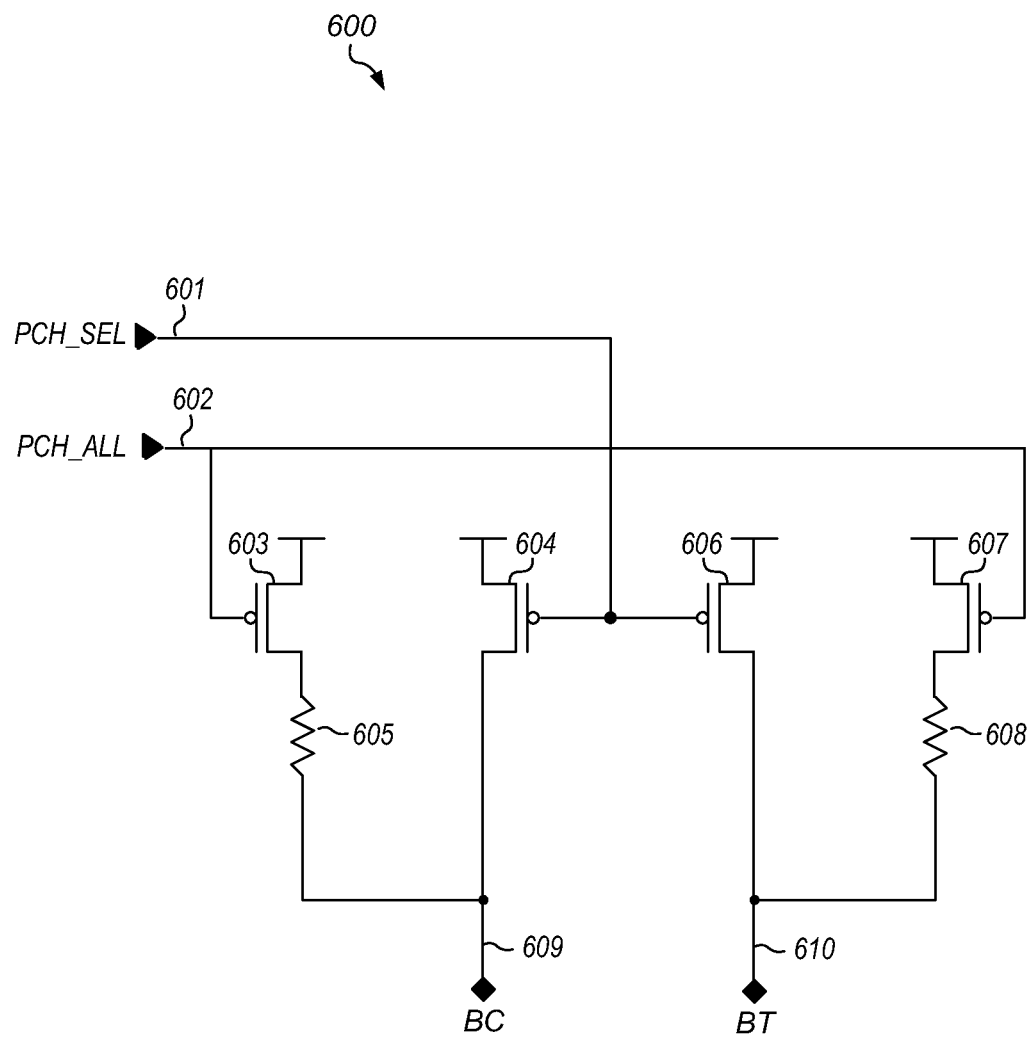
FIG. 6 illustrates an embodiment of a pre-charge circuit employing passive resistors.

Another embodiment of a pre-charge circuit which may be employed as one or more of pre-charge circuits 317a-317d in sub-array 300 is illustrated in FIG. 6. In the illustrated embodiment, pre-charge circuit 600 includes pre-charge selected signal 601 denoted as "pch_sel," pre-charge all signal 602 denoted as "pch_all," complement bit line port 609 denoted as "bc," and true bit line port 610 denoted as "bt." In various embodiments, complement bit line port 609 and true bit line port 610 may be coupled to a pair of bit lines 316 as depicted in sub-array 300 as illustrated in FIG. 3.

Pre-charge selected signal 601 controls pull-up devices 604 and 606, which are, in turn, coupled to complement bit line port 609 and true bit line port 610, respectively. Pre-charge all signal 602 controls pull-up devices 603 and 607. Pull-up device 603 is coupled to resistor 605, which is further coupled to complement bit line port 609, and pull-up device 607 is coupled to resistor 608, which is further coupled to true bit line port 610.

Resistors 605 and 608 may, in some embodiments, be implemented using a polysilicon layer, a metal wiring layer, a diffusion layer, or any suitable layer included in a semiconductor manufacturing process. In other embodiments, the resistors may be designed to provide an impedance such that when pull-up devices 603 and 607 are active, the voltage level at complement bit line port 609 and true bit line port 610 may be less than the power supply voltage.

Operation of pre-charge circuit 600 is similar to that described above in reference to pre-charge circuit 500 as illustrated in FIG. 5. Pre-charge all signal 602 may be set low activating pull-up devices 603 and 607, thereby charging bit lines coupled to complement bit line port 609 and true bit line port 610, respectively, to the power supply voltage less a voltage drop across resistors 605 and 608. Once the voltage levels at complement bit line port 609 and true bit line port 610 have achieved a steady state, pre-charge all signal 602 may be set high, thereby deactivating pull-up devices 603 and 607.

Prior to a read operation, pre-charge selected signal may be set to a low logic level, activating pull-up devices 604 and 606. Once activated, pull-up devices 604 and 606 may continue charging bit lines coupled to complement bit line port 609 and true bit line port 610 until the voltage on the bit lines reaches the power supply voltage. Pre-charge selected signal 601 may then be set to a high logic level, deactivating pull-up devices 604 and 606, and allowing for the completion of a read operation. The circuit elements depicted in pre-charge circuit 600 are merely an example. In other embodiments, different circuits elements may be employed.

Figure 7:
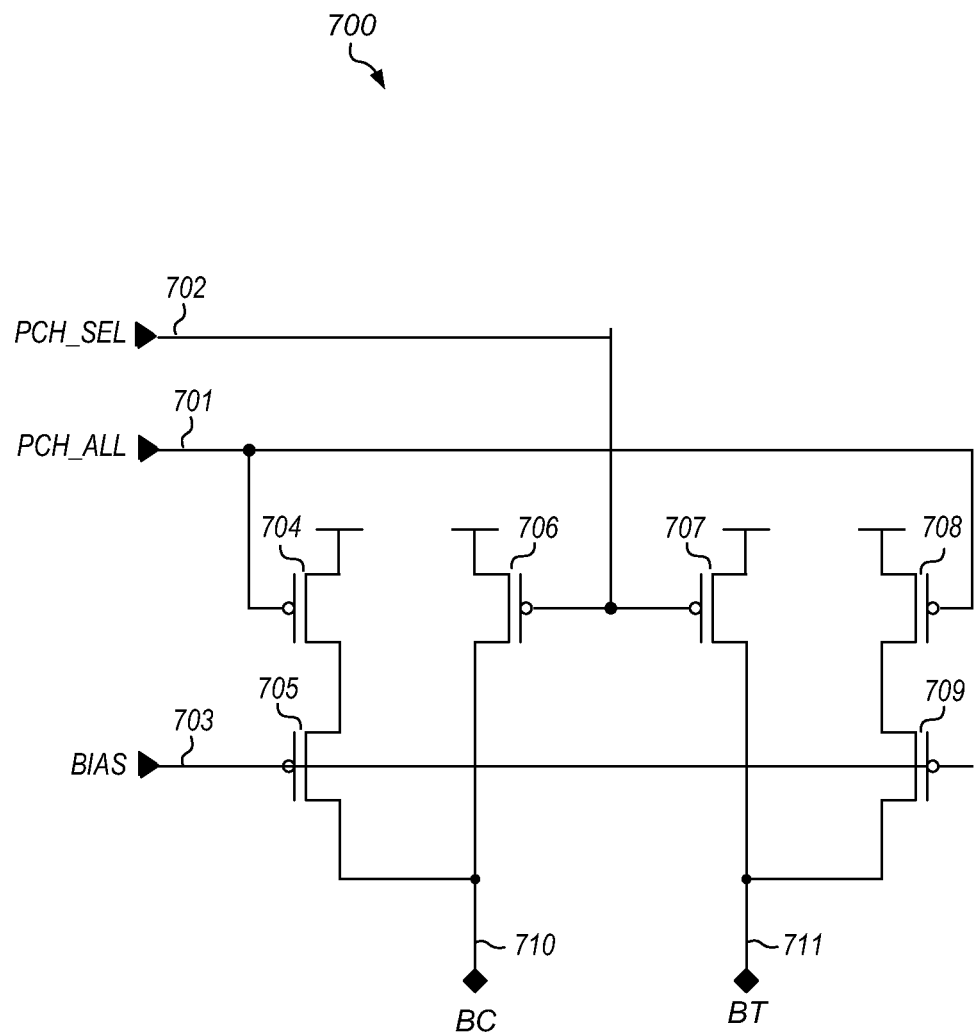
FIG. 7 illustrates an embodiment of a pre-charge circuit employing active resistors.

Turning to FIG. 7, another embodiment of a pre-charge circuit is illustrated. Pre-charge circuit 700 may, in some embodiments, correspond to pre-charge circuits 317a-317d of sub-array 300 as illustrated in FIG. 3. In the illustrated embodiment, pre-charge circuit 700 includes pre-charge selected signal 702 denoted as "pch_sel," pre-charge all signal 701 denoted as "pch_all," bias signal 703 denoted as "bias," complement bit line port 710 denoted as "bc," and true bit line port 711 denoted as "bt." In various embodiments, complement bit line port 710 and true bit line port 711 may be coupled to a pair of bit lines 316 as depicted in sub-array 300 as illustrated in FIG. 3.

Pre-charge selected signal 702 controls pull-up devices 706 and 707, which are coupled to complement bit line port 710 and true bit line port 711, respectively. Pre-charge all signal 701 controls pull-up devices 704 and 708. Pull-up device 704 is coupled to device 705, which is controlled by bias signal 703, and pull-up device 708 is coupled to device 709, which is controlled by bias signal 703. Devices 705 and 709 are coupled to complement bit line port 710 and true bit line port 711, respectively.

The operation of pre-charge circuit 700 is similar to the operation of pre-charge circuit 500 as described above. At the beginning of an access to a memory device, pre-charge all signal 701 may be set to a low level, activating pull-up devices 704 and 708, causing the drains of pull-up devices 704 and 708 to charge to the voltage level of the power supply. Bias signal 703 is then set to a pre-determined voltage controlling the current flowing through device 705 and 709. By adjusting the current flowing through devices 705 and 709, the voltage level of bit lines coupled to complement bit line port 710 and true bit line port 711 may be controlled. In some embodiments, the voltage level of bit lines coupled to complement bit line port 710 and true bit line port 711 may be less than the power supply voltage.

A voltage reference circuit employing supply independent biasing techniques, or any other suitable bias technique may in some embodiments, generate bias signal 703. In other embodiments, bias signal 703 may be generated as part of a distributed current mirror circuit, where devices 705 and 709 are included in the distributed current mirror circuit. Bias signal 703 may, in some embodiments, be a static (i.e., non-varying in time) signal. In other embodiments, bias signal 703 may be varied as a function of the voltage at complement bit line port 710 and/or true bit line port 711.

Prior to a read operation, pre-charge all signal 701 may be set to a high logic level, deactivating pull-up devices 704 and 708. Pre-charge selected signal may then be set to a low logic level, activating pull-up devices 706 and 707, thereby charging bit lines coupled to complement bit line port 710 and true bit line port 711 to the power supply voltage level. Pre-charge selected signal 702 may then be set to a high logic level, deactivating pull-up devices 706 and 707. The read operation may then be completed.

It is noted that the pre-charge circuit illustrated in FIG. 7 is merely an example. In other embodiments, different numbers of devices and different operations of the devices may be employed.

Figure 8:
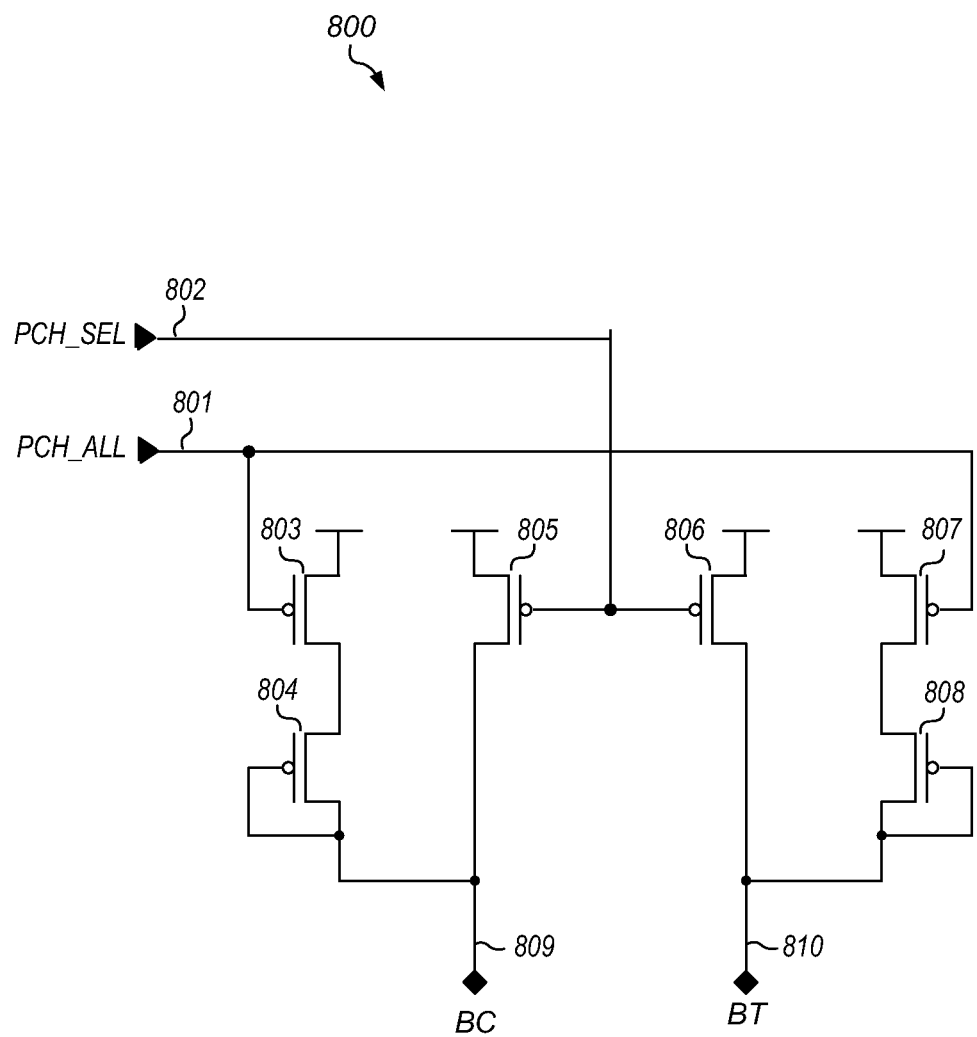
FIG. 8 illustrates an embodiment of a pre-charge circuit employing diode-connected transistors.

Another embodiment of a pre-charge circuit, which may correspond to pre-charge circuits 317a-317d of sub-array 300, is illustrated in FIG. 8. In the illustrated embodiment, pre-charge circuit 800 includes pre-charge all signal 801 denotes as "pch_all," pre-charge selected signal 802 denoted as "pch_sel," complement bit line port 809 denoted as "bc," and true bit line port 810 denoted as "bt." In various embodiments, complement bit line port 809 and true bit line port 810 may be coupled to a pair of bit lines 316 as depicted in sub-array 300 as illustrated in FIG. 3.

Pre-charge selected signal 802 controls pull-up devices 805 and 806, which are coupled to complement bit line port 809 and true bit line port 810, respectively. Pre-charge all signal 801 controls pull-up devices 803 and 807, which are coupled to devices 804 and 808, respectively. Device 804 is further coupled to complement bit line port 809, and device 808 is further coupled to true bit line port 810.

The gate of device 804 is coupled to the drain of device 804, and the gate of device 808 is coupled to the drain of device 808. This type of connection is commonly referred to as "diode connected" and allows devices 804 and 808 to function as a forward-biased diode. When used in diode connected fashion, a device such as, devices 804 and 808, may allow current to flow through the device and may generate a voltage drop across the device equal to the threshold voltage of the device. In some embodiments, devices 804 and 808 may be implemented as p-n junction diodes or any other suitable device that exhibits current-voltage characteristics similar to a diode.

The operation of pre-charge is similar to that described above in reference to pre-charge circuit 500 as illustrated in FIG. 5. At the beginning of a memory access, pre-charge all signal 801 is set to a low logic level, activating pull-up devices 803 and 807, causing the drains of pull-up devices 803 and 807 to charge to the voltage level of the power supply. A voltage is dropped across devices 804 and 808 corresponding to the threshold voltages of the devices 804 and 808. The new voltage is propagated to bit lines coupled to complement bit line port 809 and true bit line port 810.

Prior to a read operation, pre-charge all signal 801 may be set to a high logic level, deactivating pull-up devices 803 and 807. Pre-charge selected signal 803 may then be set to a low logic level, activating pull-up devices 805 and 806. Once pull-up devices 805 and 806 have been activated, bit lines coupled complement bit line port 809 and true bit line port 810 may be charged to the voltage level of the power supply. Pre-charge selected signal 802 may then be set to a high logic level, deactivating pull-up devices 805 and 806. The read operation may then be completed.

It is noted that pre-charge circuit 800 is merely an example. In other embodiments, pre-charge circuit 800 may be coupled to one a single data line for use with singled-ended memory architectures.

Figure 9:
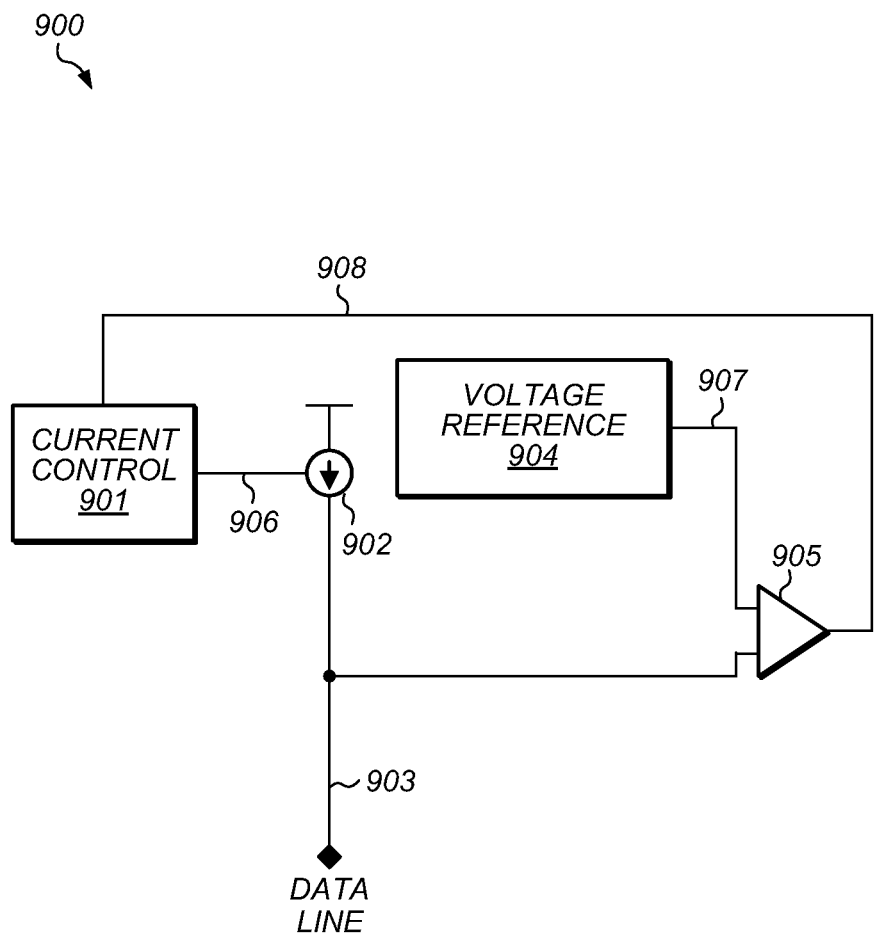
FIG. 9 illustrates a block diagram of an embodiment of a data line pre-charge circuit.

FIG. 9 illustrates a particular embodiment of pre-charge circuit that may be employed as pre-charge circuits 317a-317d of sub-array 300. In the illustrated embodiment, pre-charge circuit 900 includes data line 903 coupled to current source 902. Data line 903 is further coupled to an input of comparator 905. Another input of comparator 905 is coupled to the output of voltage reference 904. Current control circuit 901 employs comparison signal 908 generated by comparator 905 to generate current control signal 906, which is coupled to current source 902.

During operation current source 902 may supply current to data line 903. The voltage level on data line 903 may be compared to a pre-determined voltage level generated by voltage reference 904. The results on the comparison may be used by current control circuit 901 to adjust the amount of current being sourced by current source 902 to data line 903.

Data line 903 may correspond, in some embodiments, to one of bit lines 316 as depicted in sub-array 300 as illustrated in FIG. 3. Although only one current source is illustrated in pre-charge circuit 900, additional current sources may be employed. For example, in reference to sub-array 300, a current source may be employed for each of bit lines 316. In some embodiments, current control circuit 901 and voltage reference 904 may be shared by multiple sub-arrays, such as sub-arrays 201A, 201B, and 201C of memory 200 as illustrated in FIG. 2.

Pre-charge circuit 900 as illustrated in FIG. 9 is merely an example. In other embodiments, different circuit elements, and different configurations of circuit elements may be employed.

Figure 10:
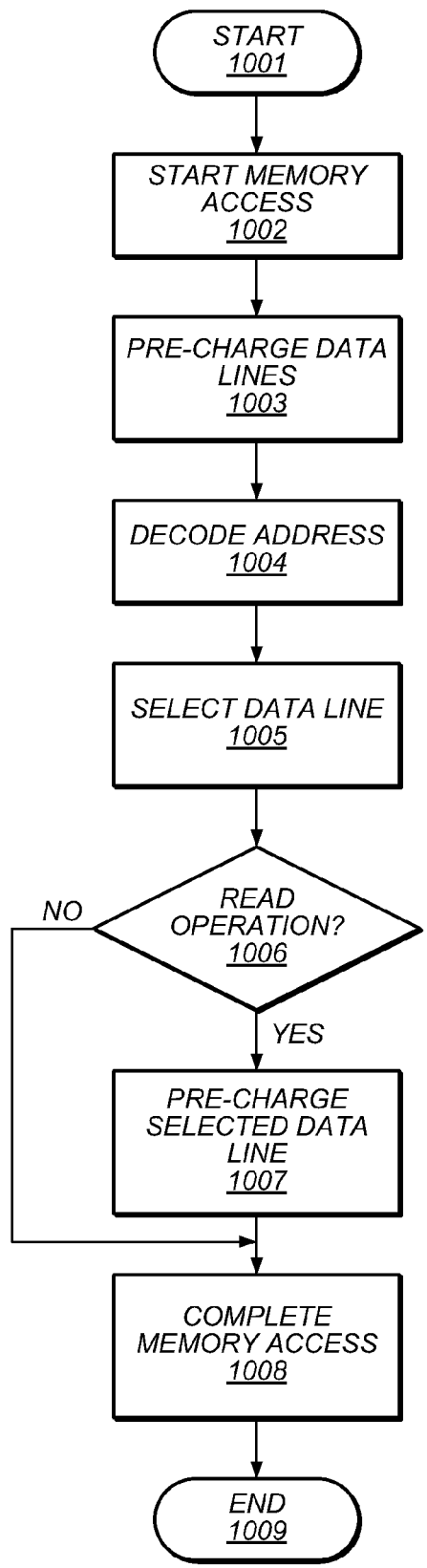
FIG. 10 illustrates a flowchart of an example method for pre-charging a memory.

An embodiment of a method for operating a memory is illustrated in FIG. 10. Referring collectively, to FIG. 2, FIG. 3, and the flowchart illustrated in FIG. 10, the method begins in block 1001. An access to memory 200 may then be started (block 1002). In some embodiments, the start of an access to memory 200 may include the assertion of clock signal 209, as well as presentation of an address value on address input 211. A value may also be presented on mode input 210.

Once the access to memory 200 has been initiated, bit lines (also referred to as data lines), such as bit lines 316 of sub-array 300, may be charged to a pre-determined voltage level (block 1003). In some embodiments, the pre-determined voltage may be less that the voltage level of the power supply, and may selected to improve stability of data cells connected to the bit lines.

The bit lines may be charged by the activation of pre-charge circuits, such as, pre-charge circuits 317A-317D as illustrated in FIG. 3. Each of pre-charge circuits 317A-317D may be similar to pre-charge circuits described above in reference to FIG. 4 through FIG. 9. The activation of the pre-charge circuits may be controlled by timing and control circuit 202, or may be controlled external to memory 200 through the use of pre-charge input 212.

With the pre-charge of the bit lines complete, address decoder 203 may be activated by the assertion of address enable signal 203 by timing and control unit 202. Address decoder 203 may then decode the address value presented to address input 211 (block 1004). As described above in more detail, address decoder 203 may employ any one of numerous decoding techniques to assert one of row selection signals 206 and one of column selection signals 207.

The asserted column selection signal may then be employed to select one of columns 301A through 301D and the column's associated bit lines (block 1005). In some embodiments, the selection may be performed using column multiplex circuit 302. In other embodiments, column selection information may be employed in the generation of pre-charge signals, such a pre-charge signal 311. In such cases, the resulting pre-charge signal may be employed as a pre-charge selected signal, such as pre-charge selected input 501 as depicted in pre-charge circuit 500 illustrated in FIG. 5.

The method then depends on if the access to memory 200 is a read access (block 1006). Timing and control circuit 202 may determine if the access is a read access by checking the value presented on mode selection input 210. In some embodiments, mode selection signal may include multiple data bits, and timing and control circuit 202 may employ a decode circuit to determine the type of access to perform. When the access is a read access, selected bit lines may be pre-charged to a different voltage level than the proceeding pre-charge (block 1007). In some embodiments, the different voltage level may be the voltage level of the power supply, or any other voltage level suitable for accessing a data storage cell coupled the selected bit lines. The pre-charging may be accomplished by employing the aforementioned pre-charge selected signals in conjunction with a pre-charge circuit such as, pre-charge circuit 500 as illustrated in FIG. 5, for example.

When the second pre-charge is complete, the remaining portion of the access to the memory may be completed (block 1008). In some embodiments, the completion of the memory access may include the activation of sense amplifiers, such as, e.g., sense amplifier 303 of sub-array 300, and the activation of output circuits, such as output circuit 305 of sub-array 300, for example. With the completion of the memory access, the method ends in block 1009. When the access is not a read access, then the memory access may then be completed as described above in more detail (block 1008).

It method illustrated in FIG. 10, some operations are depicted as being performed in a sequential fashion. In other embodiments, some or all of the operations may be performed in parallel.

Figure 11:
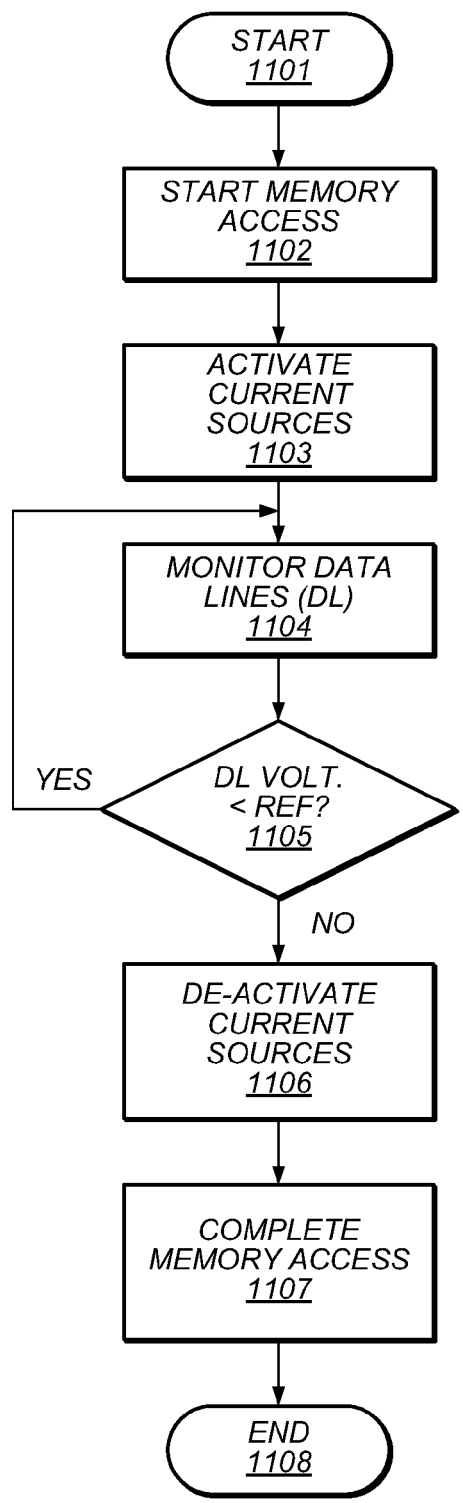
FIG. 11 illustrates a flowchart of an example method for pre-charging a data line.

Turning to FIG. 11, a flowchart of a method for operating a pre-charge circuit, such as pre-charge circuits 317a-317d of sub-array 300 as depicted in FIG. 3, to charge a data line to a pre-determined voltage is illustrated. Referring collectively to memory 200 as illustrated in FIG. 2, pre-charge circuit 900 as illustrated in FIG. 9, and the flowchart illustrated in FIG. 11, the method begins in block 1101.

A memory access may then be started (block 1102). In some embodiments, clock input 209 may be asserted to start a memory cycle. Mode control input 210 may be sampled and then stored in timing and control circuit 202. In various embodiments, timing and control circuit 202 may assert address enable 206, and the value on address input 211 may be sampled within address decoder 203.

Current sources within sub-arrays 201A through 201C, such as, e.g., current source 902, may then be activated (block 1103). In some embodiments, timing and control unit 202 may assert a control signal, such as one of control signals 204, for example, that activates current control circuit 901. In some embodiments, the control signal may also activate voltage reference 904 while, in other embodiments, voltage reference 904 may be controlled independently.

With the activation of current control circuit 901, current control signal 906 may be set to a voltage level necessary for current source 902 to source a pre-determined current to data line 903. Current control signal 906 may be generated by a bias circuit, current mirror, or any other suitable circuit, included within current control circuit 901.

As current is sourced to data line 903, the voltage on data line 903 may be monitored (block 1104). In some embodiments, the voltage level on data line 903 may be monitored by employing a comparator, such as, e.g., comparator 905, to compare the voltage level on data line 903 to a pre-determined voltage level. Comparator 905 may include a differential amplifier, or any other suitable comparison circuit, and the output of comparator 605 (comparison signal 908) may be employed by current control circuit 901 to adjust current control signal 906. In various embodiments, comparison signal 908 may be an analog signal, and current control circuit 901 may employ an analog-to-digital converter (ADC) to convert the analog signal to a series of digital samples for further processing prior to the adjustment of current control signal 906.

In some embodiments, the pre-determined voltage level may be generated by voltage reference circuit 904. Voltage reference circuit 904 may, in various embodiments, include a supply and temperature independent reference circuit, such as, e.g., a band-gap reference. In some embodiments, the pre-determined voltage level may be selected dependent upon the stability characteristics of data storage cells, i.e., a voltage level may be selected to improve the stability of unselected data storage cells within a memory array. The pre-determined voltage level may be selected, in other embodiments, based on power supply voltage, temperature, or any other suitable process or operating parameter.

The method then depends on the voltage level on data line 903 (block 1105). When the voltage level on data line 903 is less than a pre-determined reference voltage, monitoring of the voltage on data line 903 continues (block 1104). When the voltage level on data line 903 is greater than or equal to the pre-determined reference voltage, current source 902 may be deactivated (block 1106).

Once current source 902 has been deactivated, the access to the memory may be completed (block 1107). In some embodiments, address decoder 203 may assert one of row selection signals 206, and one of column selection signals 207 based upon the value presented on address input 211 at the beginning of the memory access. The assert column selection signal may be employed to selectively charge data lines within sub-arrays 201A, 201B, and 201C, to a different voltage as described above with respect to pre-charge circuit 800 as illustrated in FIG. 8. The selective charging of data lines within sub-arrays 201A, 201B, and 201C may, in some embodiments, depend on the value present on mode control input 210 at the beginning of the memory access. With the continuation of the memory access, the method concludes in block 1108.

It is noted that the method illustrated in FIG. 11 is merely an example. In other embodiment, different operations, and different orders of operations are possible and contemplated.

Numerous variations and modifications will become apparent to those skilled in the art once the above disclosure is fully appreciated. It is intended that the following claims be interpreted to embrace all such variations and modifications.

What is claimed is:

1. A memory, comprising:
   a plurality of data lines, wherein each data line of the plurality of data lines is coupled to a plurality of data storage cells; and
   a plurality of pre-charge circuits, wherein each pre-charge circuit of the plurality of pre-charge circuits is coupled to a respective data line of the plurality of data lines, and wherein each pre-charge circuit of the plurality of pre-charge circuits is configured to:
   charge the respective data line of the plurality of data lines to a first voltage level responsive to a first control signal, wherein the first control signal is asserted in response to receiving a command to access the memory; and
   charge the respective data line of the plurality of data lines to a second voltage level responsive to an assertion of a respective one of a plurality of second control signals in response to a determination that the command specifies a read operation wherein the first voltage level is different from the second voltage level.

2. The memory of claim 1, wherein first voltage level is lower than the second voltage level.

3. The memory of claim 1, further comprising a control circuit configured to decode a received address.

4. The memory of claim 3, wherein the assertion of the respective one of the plurality of second control signals is dependent upon the decoded received address.

5. The memory of claim 1, wherein each of the pre-charge circuits comprises a pull-up device coupled in series with a resistor to the respective data line.

6. The memory of claim 5, wherein the pull-up device comprises a p-channel metal-oxide semiconductor field-effect transistor.

7. A method, comprising:
   receiving a command and an address;
   charging each data line of a plurality of data lines to a first voltage level responsive to receiving the command, wherein each data line is coupled to a plurality of data storage cells;
   detecting a read operation dependent upon the received command;
   decoding the received address;
   selecting a given data line of the plurality of data lines dependent upon the decoded received address; and
   charging, responsive to the detection of the read operation, the given data line of the plurality of data lines to a second voltage level wherein the first voltage level is different from the second voltage level.

8. The method of claim 7, wherein the second voltage level is larger than the first voltage level.

9. The method of claim 7 further comprising completing the read operation responsive to the charging of the selected data line to the second voltage level.

10. The method of claim 7, wherein charging each data line of the plurality of data lines to the first voltage level comprises sourcing a first current to each data line of the plurality of data lines.

11. The method of claim 10, wherein charging the selected data line to a second voltage level comprises souring a second current to the selected data line.

12. The method of claim 11, wherein charging the selected data line to a second voltage levels comprises monitoring a voltage level of the selected data line.

13. The method of claim 11, wherein the second current is smaller than the first current.

14. A system, comprising:
    a processor; and
    one or more memories, wherein each memory of the one or more memories comprises:
        a control circuit configured to:
            generate a pre-charge signal responsive to the detection of a start of a memory access; and
            detect when the memory access is a read operation dependent upon a received command;
        a decode circuit configured to, responsive to the detection of the read operation, activate one of a plurality of pre-charge selection signals dependent upon a received address; and
        a plurality of columns coupled to the respective plurality of pre-charge selection signals, wherein each column of the plurality of columns comprises:
            a data line, wherein the data line is coupled to a plurality of data storage cells; and
            a pre-charge circuit coupled to the data line, wherein the pre-charge circuit is configured to:
                charge the data line to a first voltage level responsive to the pre-charge signal; and
                charge the data line to a second voltage level responsive to the activation of a respective one of the plurality pre-charge selection signals wherein the first voltage level is different from the second voltage level.

15. The system of claim 14, wherein the first voltage level is less than the second voltage level.

16. The system of claim 14, wherein the pre-charge circuit comprises a current source.

17. The system of claim 14, wherein the pre-charge circuit comprises a diode-connected metal-oxide field-effect transistor (MOSFET).

18. The system of claim 14, wherein the pre-charge circuit comprises a resistor coupled to the data line, wherein the resistor is further coupled to a pull-up device.

19. The system of claim 14, wherein the pre-charge circuit comprises a voltage clamp circuit.

* * * * *

UNITED STATES PATENT AND TRADEMARK OFFICE
CERTIFICATE OF CORRECTION

PATENT NO. : 8,947,963 B2  
APPLICATION NO. : 13/739546  
DATED : February 3, 2015  
INVENTOR(S) : Edward M. McCombs Page 1 of 1

It is certified that error appears in the above-identified patent and that said Letters Patent is hereby corrected as shown below:

In the Claims:

Claim 1, Column 14, Line 32, please delete "operation wherein" and substitute
-- operation; wherein --

Claim 7, Column 14, Line 60, please delete "level wherein" and substitute -- level; wherein --

Claim 14, Column 16, Lines 12-13, please delete "signals wherein" and substitute
-- signals; wherein --

Signed and Sealed this
Seventh Day of July, 2015

Michelle K. Lee
*Director of the United States Patent and Trademark Office*